United States Patent [19]

Matsushita et al.

[11] Patent Number: 5,705,421

[45] Date of Patent: Jan. 6, 1998

[54] A SOI SUBSTRATE FABRICATING METHOD

[75] Inventors: Takeshi Matsushita; Etsuo Morita, both of Kanagawa; Tsuneo Nakajima, Chiba; Hiroyuki Hasegawa; Takayuki Shingyouji, both of Saitama, all of Japan

[73] Assignees: Sony Corporation; Mitsubishi Materials Corporation; Mitsubishi Materials Silicon Corporation, all of Tokyo, Japan

[21] Appl. No.: 561,865

[22] Filed: Nov. 22, 1995

[30] Foreign Application Priority Data

Nov. 24, 1994 [JP] Japan ................................. 6-314016

[51] Int. Cl.$^6$ ................................................. H01L 21/76
[52] U.S. Cl. .............................. 437/62; 148/DIG. 12; 437/86; 437/974; 156/632.1
[58] Field of Search ....................... 437/62, 86, 974; 148/DIG. 12, DIG. 135; 156/632.1

[56] References Cited

U.S. PATENT DOCUMENTS

| | | |
|---|---|---|
| 5,013,681 | 5/1991 | Godbey et al. |
| 5,234,535 | 8/1993 | Beyer et al. ............... 148/DIG. 12 |
| 5,310,451 | 5/1994 | Tejwani et al. |
| 5,344,524 | 9/1994 | Sharma et al. |

FOREIGN PATENT DOCUMENTS

| | | |
|---|---|---|
| 2-126625 | 5/1990 | Japan. |
| 0417838 | 3/1991 | Japan. |
| 3-109731 | 5/1991 | Japan. |

OTHER PUBLICATIONS

Maszara, W.P. et al., "Bonding of Silicon Wafers for Silicon-on-Insulator", J. Appl. Phys. 64(10), Nov. 1988, pp. 4943–4950.

Mitani, K., "Wafer Bonding . . . A Review", J. Elect. Mater., Jul. 1992, vol. 21, No. 7 pp. 669–676.

*Primary Examiner*—George R. Fourson
*Attorney, Agent, or Firm*—Hill, Steadman & Simpson

[57] ABSTRACT

A SOI substrate fabricating method comprises the steps of: making a first etch-stop layer on a silicon substrate; polishing the surface of the first etch-stop layer; making a silicon buffer layer on the polished surface of the first etch-stop layer; making a silicon layer on the silicon buffer layer; making an insulating layer on the silicon layer; bonding one of major surfaces of a support substrate onto the insulating layer; and removing the silicon substrate, the first etch-stop layer and the silicon buffer layer and maintaining the insulating layer and the silicon layer on the one surface of the support substrate. Another SOI substrate fabricating method comprising the steps of: making a first etch-stop layer on a silicon substrate; polishing one surface of the first etch-stop layer; making a silicon buffer layer on the polished surface of the first etch-stop layer; making a compound semiconductor layer comprising silicon and at least one of germanium and carbon on the silicon buffer layer; making an insulating layer on the compound semiconductor layer; bonding one of major surfaces of a support substrate onto the insulating layer; and removing the silicon substrate, the first etch-stop layer and the silicon buffer layer and maintaining the insulating layer and the compound semiconductor layer on the one surface of the support substrate.

20 Claims, 4 Drawing Sheets

A SOI SUBSTRATE FABRICATING METHOD

BACKGROUND OF THE INVENTION

1. Field of the Invention

This invention relates to a SOI (Silicon-on-Insulator) substrate fabricating method suitable for use in fabrication of a large-scale integrated semiconductor integrated circuit, for example.

2. Related Art

To break through the limit of VLSI (Very-Large-Scale Integrated circuits), SOI techniques for making a single-crystal Si layer on an insulating substrate are studied worldwide. Among such SOI techniques, SIMOX (Separation by Implanted Oxygen) process and bonded-wafer process are currently remarked.

SIMOX process is a method for making SOI by heavy ion implantation of oxygen into a Si substrate. However, heavy ion implantation of oxygen causes dislocation or other crystal defects in the Si active layer, which restricts the performance of the device made by using the Si active layer (for example, CMOS). On the other hand, bonded-wafer process makes SOI by first bonding two wafers and shaping one of the wafers into a thin film. Techniques for shaping a wafer into a thin film include grinding and polishing; however, currently available mechanical polishing techniques are limited in polishing accuracy, and the minimum thickness of SOI they can provide is around 1 μm.

For VLSI-CMOS, which requires a Si active layer of a thickness of 0.1 μm or less is required, some methods called bonding and etch-back SOI (BESOI) process are under development. BESOI methods include a process in which an etch-stop layer is provided on a Si substrate to control the thickness of SOI made by selective etching, and a process in which the thickness of the Si active layer is measured such that the thickness of SOI is controlled by executing local plasma etching based on the data.

A typical process for fabricating a BESOI substrate is explained below with reference to FIGS. 1 to 3.

As shown in FIG. 1, formed on a Si substrate 51 prepared as a seed wafer are a heavily boron(B)-doped p$^+$-type Si layer 52 behaving as a etch-stop layer, a Si active layer 53 on the p$^+$-type Si layer 52, and a silicon dioxide (SiO$_2$) film 54 on the Si active layer 53.

After that, as shown in FIG. 2, another silicon substrate 55 as a support substrate (also called handle wafer) is bonded onto the SiO$_2$ film 54.

The seed wafer, Si substrate 51, is next ground and polished from its back surface to thin it into a film of a thickness from 1 μm to 2 μm, and the resulting thin film of Si substrate 51 is removed by chemical etching using a solution containing ethylenediamine, pure water, pyrocatechol and pyrazine as taught in Journal of Electrochemical Society, Vol. 137, 3626 (1990). In this etching process, since a difference in concentration of B in Si permits a large etch selectivity of the Si substrate 51 with respect to the p$^+$-type Si layer 52, substantially the entirety of the p$^+$-type Si layer 52 remains non-etched even after the remainder of the Si substrate 51 in the form of a thin film is fully etched off.

After that, the entirety of the p$^+$-type Si layer 52 is removed by chemical etching using a solution containing hydrofluoric acid, nitrate and acetic acid. As a result, the surface of the Si active layer 53 is exposed, and the intended SOI substrate is obtained.

However, with the conventional SOI fabricating method described above, it is difficult to realize SOI having the film thickness of 50 nm or less, TTV (Total Thickness Variation) of 10% or less of the film thickness, and surface roughness of 0.3 nm or less, which will be required in fabrication of future VLSI-CMOS.

For example, TTV of 10% or less are not readily accomplished by local etch-back using plasma etching. The selective etch-back method using the B-doped p$^+$-type Si layer 52 as the etch-stop layer requires heavy doping of B to increase the etch selectivity, which, however, causes crystal defects such as dislocation in the p$^+$-type Si layer 52, extension of such crystal defects to the Si active layer 53 epitaxially grown on the p$^+$-type Si layer 52, or diffusion of B from the p$^+$-type Si layer 52 into the Si active layer 53 due to a high temperature annealing for bonding wafers, which all are impediments to fabrication of acceptable CMOSs.

On the other hand, PCT Laid-Open WO 91/05366 discloses a method for fabricating SOI substrates by using an etch-stop layer made of a compound of Si and one or more of other group IV elements. When using such an etch-stop layer, an increase of the content of the other group IV element or elements to increase the etch selectivity invites a strain in the etch-stop layer, which in turn causes dislocation for relaxing the strain, or the etch-stop layer increases TTV and surface roughness of the Si active layer 53. These phenomena not only cause a decrease in bonding strength due to generation of bubbles but also invite deterioration in breakdown voltage during fabrication of a very thin gate oxide film, 5 nm thick, for example, on the Si active layer 53. Therefore, also this technique is difficult to use in fabrication of future VLSI.

As discussed above, none of the conventional techniques can successfully fabricate SOI substrates with small TTV, uniform film thickness and small surface roughness which are required for fabricating VLSI-CMOS.

OBJECTS AND SUMMARY OF THE INVENTION

It is therefore an object of the invention to provide a SOI substrate fabricating method capable of fabricating a SOI substrate in which a silicon layer with small TTV, uniform film thickness and small surface roughness is formed on an insulating substrate.

The present inventors got the following knowledge through efforts for overcoming the above-mentioned problems heretofore attendant to fabrication of SOI substrates.

The present inventors prepared a sample with a heavily B-doped p$^+$-type Si layer by thermally diffusing B onto the surface of a Si substrate, and measured the surface roughness of the p$^+$-type Si layer through an atomic force microscope (AFM). As a result, the surface roughness of the p$^+$-type Si layer was as large as 0.2 nm to 0.4 nm, although it varies with concentration of B, and depressions with depths from 1 nm to 3 nm were observed in the surface of the p$^+$-type Si layer under certain conditions of thermal diffusion. It was also known that washing or other treatment of the sample may cause such deep depressions.

Although it is still unknown why such deep depressions are produced in the surface of the p$^+$-type Si layer, a possible reason would be that hard borides in the form of fine particles are formed along the surface of the p$^+$-type Si layer during thermal diffusion of B onto the surface of the Si substrate, and they drop away for some reason.

Since the B-doped p$^+$-type Si layer has a large surface roughness and often includes deep depressions along the surface, if the layer in this state is used as the etch-stop layer for fabricating SOI substrates, bonding of substrates or other process is adversely affected. To prevent this problem it is advantageous that the surface of the B-doped p$^+$-type Si layer, after being made, is polished to decrease the surface roughness and remove deep depressions.

The polishing is effective also when a layer other than a B-doped p$^+$-type Si layer is used as a first etch-stop layer, if the layer, just made, has a large surface roughness and has deep depressions.

As to a $Si_{1-x}Ge_x$ layer made on a Si substrate, the present inventors realized, through observation by AFM, that the surface roughness is relatively large but decreases as the Ge composition ratio x decreases, that the surface is made planar by providing a Si buffer layer between the Si substrate and the $Si_{1-x}Ge_x$ layer, and that depressions and protrusions are present along the surface, which are probably caused by dislocation which occur along the interface when the thickness of the $Si_{1-x}Ge_x$ layer surpasses the critical film thickness. Other samples were also made by making a B-doped p$^+$-type Si layer and further making thereon a Si buffer layer, $Si_{1-x}Ge_x$ layer and Si layer, some of the samples being subsequently annealed under the same conditions as those for bonding. Observation of the surfaces of the uppermost Si layers of both the annealed samples and the non-annealed samples through AFM revealed that the particle size in the surface and the surface roughness of the Si layer increase with increase in thickness of the $Si_{1-x}Ge_x$ layer and that the surface morphology and the surface roughness of the Si layer do not change when annealed.

As described, the surface roughness of the $Si_{1-x}Ge_x$ layer is relatively large, and the Si layer formed on the $Si_{1-x}Ge_x$ layer inherits the large surface roughness of the underlying $Si_{1-x}Ge_x$ layer, which is as large as, for example, 0.3 μm to 0.6 μm although depending on whether annealed or not. Since the large surface roughness prevents reliable bonding of substrates, it is advantageous to polish the surface of the Si layer to decrease the surface roughness to a degree acceptable for reliable bonding.

Such polishing is effective also when a layer other than the $Si_{1-x}Ge_x$ layer is used as a second etch-stop layer when the layer, just made, has a large surface roughness or includes deep depressions along its surface.

Removal of the $Si_{1-x}Ge_x$ layer after bonding of the Si substrate is possible also by polishing or etching. If etching is used for the removal, since the roughness of the surface of the Si layer exposed by the etching is large, it is advantageous that the surface of the Si layer exposed by the etching is polished to decrease its surface roughness, considering that a device is made by using the Si layer.

The above statement also applies also when a compound semiconductor layer including Si and at least one of Ge and C (for example, SiC layer) in lieu of the Si layer.

The present invention has been made from the above-mentioned knowledge of the present inventors.

That is, to attain the object, according to a first aspect of the invention, there is provided a SOI substrate fabricating method comprising the steps of:

making a first etch-stop layer on a silicon substrate;

polishing the surface of the first etch-stop layer;

making a silicon buffer layer on the polished surface of the first etch-stop layer;

making a silicon layer on the silicon buffer layer;

making an insulating layer on the silicon layer;

bonding one surface of a support substrate onto the insulating layer; and removing the silicon substrate, first etch-stop layer and silicon buffer layer and maintaining the insulating layer and the silicon layer on one surface of the support substrate.

According to a second aspect of the invention, there is provided a SOI substrate fabricating method comprising the steps of:

making a first etch-stop layer on a silicon substrate;

polishing one surface of the first etch-stop layer;

making a silicon buffer layer on the polished surface of the first etch-stop layer;

making a compound semiconductor layer comprising silicon and at least one of germanium and carbon on the silicon buffer layer;

making an insulating layer on the compound semiconductor layer;

bonding one surface of a support substrate onto the insulating layer; and removing the silicon substrate, the first etch-stop layer and the silicon buffer layer and maintaining the insulating layer and the compound semiconductor layer on one surface of the support substrate.

In the SOI substrate fabricating method according to the first invention summarized above, since the step for polishing the surface of the first etch-stop layer is used, even when the boron-doped p$^+$-type silicon layer permitting a large etch selectivity is used as the first etching layer, the surface roughness of the first etch-stop layer is made sufficiently small by polishing the layer deep enough to remove depressions or the like along the surface of the boron-doped p$^+$-type silicon layer. Accordingly, the silicon buffer layer, silicon layer and insulating layer formed on the first etch-stop layer and inheriting the surface roughness of the first etch-stop layer also have a small surface roughness. Therefore, reliable bonding is possible without impediments such as bubbles which are otherwise generated along the bonding surfaces when the silicon substrate is bonded to the support substrate. As a result, SOI substrates in which the silicon layer with small TTV, uniform film thickness and small surface roughness is made on the insulating substrate can be fabricated.

When the second etch-stop layer in addition to the first etch-stop layer is made between the silicon buffer layer and the silicon layer, removal of the silicon substrate and the silicon buffer layer can be performed with a high accuracy.

When the method includes the step of polishing the surface of the silicon layer before the insulating layer is formed on the silicon layer and the step of polishing the surface of the silicon layer after the insulating layer and the silicon layer are held on one surface of the support substrate, the roughness of the surface of the silicon layer exposed after removal of the second etch-stop layer can be made sufficiently small to approximately 0.2 nm, for example.

The above statement also applies to the SOI substrate fabricating method according to the second aspect of the invention in which the compound semiconductor layer comprising silicon and at least one of germanium and carbon is used in lieu of the silicon layer.

The above, and other, objects, features and advantage of the present invention will become readily apparent from the following detailed description thereof which is to be read in connection with the accompanying drawings.

DETAILED DESCRIPTION OF THE PREFERRED EMBODIMENT

An embodiment of the invention is explained below with reference to the drawings.

FIGS. 4 to 13 show a SOI substrate fabricating method according to the embodiment of the invention.

Figure 1:
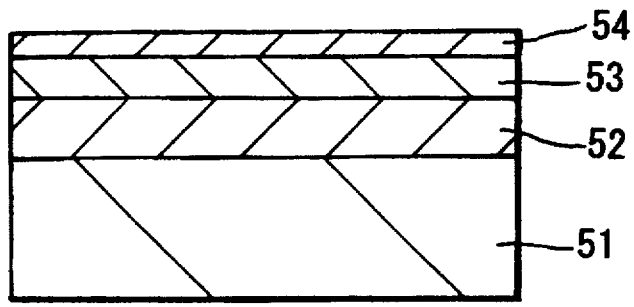
FIG. 1 is a cross-sectional view for explaining a conventional SOI substrate fabricating method.
Figure 2:
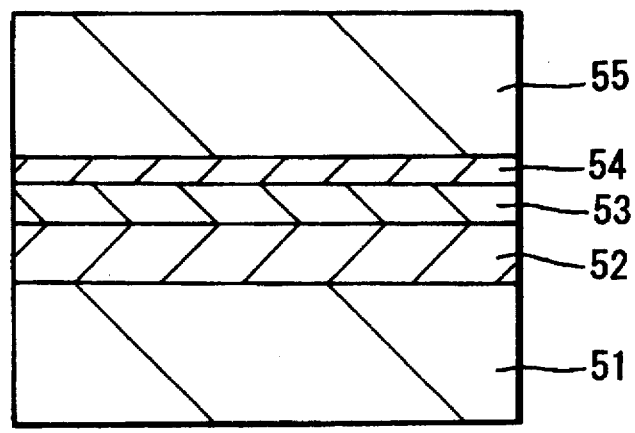
FIG. 2 is a cross-sectional view for explaining the conventional SOI substrate fabricating method.
Figure 3:
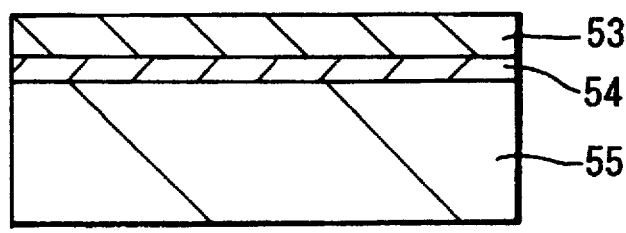
FIG. 3 is a cross-sectional view for explaining the conventional SOI substrate fabricating method.
Figure 4:
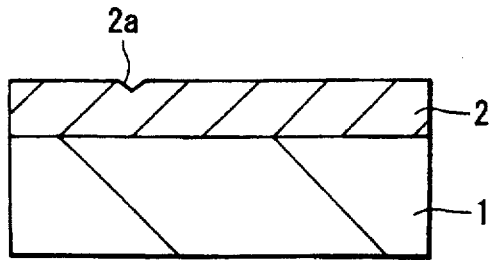
FIG. 4 is a cross-sectional view for explaining a SOI substrate fabricating method according to an embodiment of the invention.

In this embodiment, as shown in FIG. 4, a B-doped $p^+$-type Si layer 2 is formed on a (100)-oriented single-crystal Si substrate 1 prepared as a seed wafer. The Si substrate 1 may be of either p-type or n-type. The $p^+$-type Si layer 2 behaves as a first etch-stop layer. The $p^+$-type Si layer 2 can be made by doping B into the surface of the Si substrate 1 by thermal diffusion from a gaseous phase or diffusion from a solid diffusion source or ion implantation, or alternatively, by epitaxial growth on the Si substrate 1. Concentration of B in the $p^+$-type Si layer 2 is preferably $5 \times 10^{19}$ cm$^{-3}$ or larger, and more preferably about $10^{20}$ cm$^{-3}$. Thickness of the $p^+$-type Si layer 2 is preferably 100 nm to 1 μm.

Surface roughness of the $p^+$-type Si layer 2 is as large as 0.2 nm to 0.4 nm, and depressions $2a$ of depths from 1 nm to 3 nm may be produced at places of the surface of the $p^+$-type Si layer substrate 2 as shown in FIG. 4. As a result, if upper layers, namely, Si buffer layer 3, $Si_{1-x}Ge_x$ layer 4, Si active layer 5 and $SiO_2$ film 6, are formed on the $p^+$-type Si layer 2 including the depressions $2a$, depressions are inherited also in these upper layers in the form of depressions $3a$, $4a$, $4b$, $5a$, $5b$, $6a$ and $6b$ shown in FIG. 14.

Figure 5:
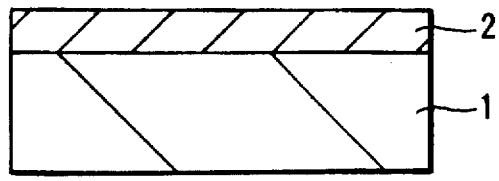
FIG. 5 is a cross-sectional view for explaining the SOI substrate fabricating method according to the embodiment of the invention.

Therefore, in order to remove such depressions $2a$ on the surface of the $p^+$-type Si layer 2 and improve its surface roughness, the surface of the $p^+$-type Si layer 2 is polished preferably by the depth of 3 nm to 200 nm as shown in FIG. 5. The value of 200 nm as the upper limit of the depth of polishing is determined to prevent excessive time for polishing. The polishing can decrease the surface roughness of the $p^+$-type Si layer 2 to 0.1 nm to 0.2 nm.

Figure 6:
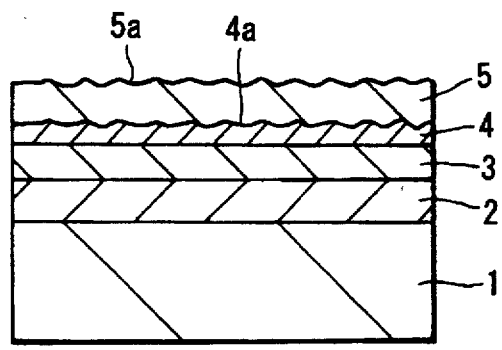
FIG. 6 is a cross-sectional view for explaining the SOI substrate fabricating method according to the embodiment of the invention.

In the next step, the product is heated in an atmosphere containing hydrogen gas at a temperature ranging from 700° C. to 1100° C., more preferably, at 750° C. from 950° C. to remove the native oxide film (not shown) on the surface of the $p^+$-type Si layer 2. After that, as shown in FIG. 6, epitaxially grown in sequence on the $p^+$-type Si layer 2 are the Si buffer layer 3, $Si_{1-x}Ge_x$ layer 4 behaving as a second etch-stop layer, and Si active layer 5.

For epitaxial growth of the Si buffer layer 3, $SiH_4$ gas or $Si_2H_6$ gas is used as a reactive gas and heated to a temperature of 600° C. to 800° C. Thickness of the Si buffer layer 3 must be a value ensuring that B does not diffuse from the $p^+$-type Si layer 2 to the $Si_{1-x}Ge_x$ layer 4 during annealing for making the $SiO_2$ film 6 on the Si active layer 5, and it is preferably 10 nm to 1 μm.

For epitaxial growth of the $Si_{1-x}Ge_x$ layer 4, a mixed gas of $SiH_4$ and $GeH_4$, or a mixed gas of $Si_2H_6$ and $GeH_4$, is used as a reactive gas and heated to 500° C. to 800° C. In this case, as the growth temperature is high, as the Ge composition ratio x is large, and as the thickness is large, unevenness of the surface of the $Si_{1-x}Ge_x$ layer 4 is large. Preferably, therefore, the growth temperature is chosen from the range of 550° C. to 750° C., Ge composition ratio x from the range of 0.03 to 0.3, and thickness from the range of 10 nm to 150 nm.

For epitaxial growth of the Si active layer 5, a $SiH_4$ gas or $Si_2H_6$ gas is used as a reactive gas and heated to 600° C. to 800° C.

Figure 7:
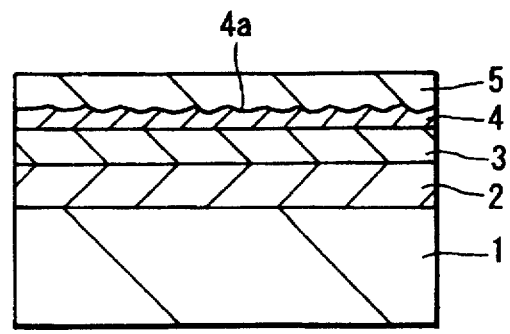
FIG. 7 is a cross-sectional view for explaining the SOI substrate fabricating method according to the embodiment of the invention.
Figure 14:
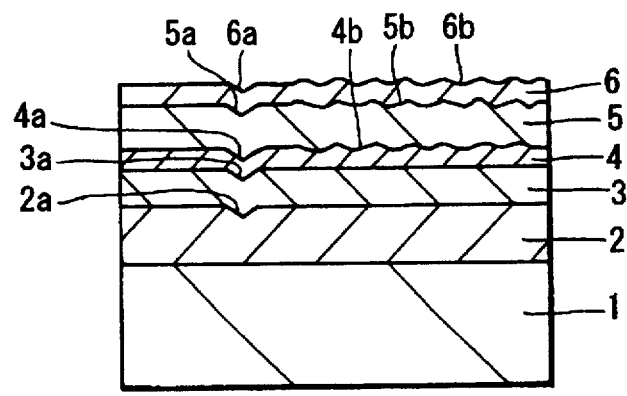
FIG. 14 is a cross-sectional view for explaining problems which occur when the SOI substrate fabricating method according to the embodiment of the invention is not used.

The Si active layer 5 inherits the surface of the $Si_{1-x}Ge_x$ layer 4 as shown in FIG. 14. In order to improve the surface roughness of the Si active layer 5 to 0.1 nm t 0.2 nm, the surface of the Si active layer 5 is polished as shown in FIG. 7.

Figure 8:
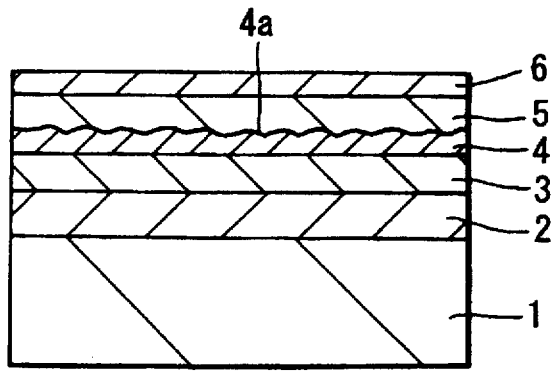
FIG. 8 is a cross-sectional view for explaining the SOI substrate fabricating method according to the embodiment of the invention.

In the next step, as shown in FIG. 8, the $SiO_2$ film 6 is formed on the Si active layer 5 by thermal oxidation or CVD.

Figure 9:
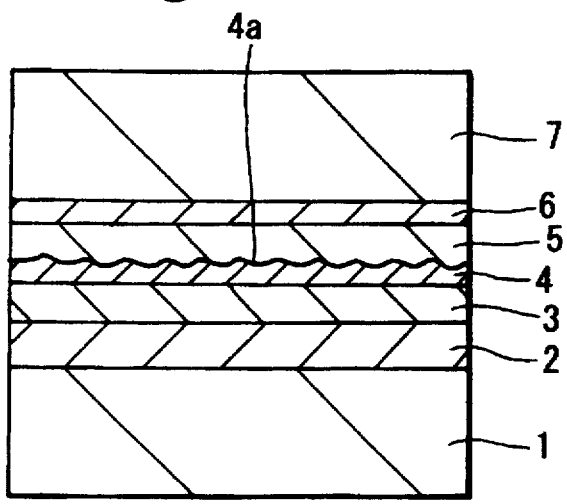
FIG. 9 is a cross-sectional view for explaining the SOI substrate fabricating method according to the embodiment of the invention.

In the next step, as shown in FIG. 9, the $SiO_2$ film 6 is brought into contact with one of surfaces of another Si substrate 7 prepared as a handle wafer, and they are bonded together by annealing at the temperature of 500° C. to 1000° C. The annealing temperature is preferably 950° C. or lower to prevent dislocation caused by relaxation of the strain in the $Si_{1-x}Ge_x$ layer 4. The bonding surface of the Si substrate 7 may remain as exposing Si or may be covered by a $SiO_2$ film.

Figure 10:
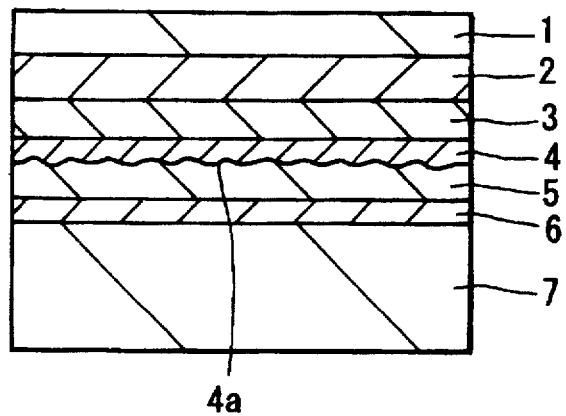
FIG. 10 is a cross-sectional view for explaining the SOI substrate fabricating method according to the embodiment of the invention.

In the next step, as shown in FIG. 10, the Si substrate 1 is ground and polished from its back surface into a thin film of a thickness of about 1 μm to 2 μm.

Figure 11:
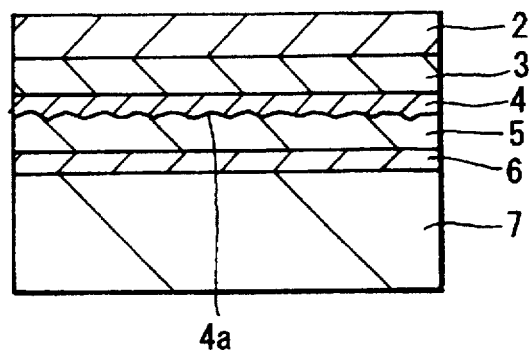
FIG. 11 is a cross-sectional view for explaining the SOI substrate fabricating method according to the embodiment of the invention.

In the next step as shown in FIG. 11, the remainder of the Si substrate 1 is removed by chemical etching using a solution containing ethylenediamine, pure water, pyrocatechol and pyrazine, for example. During this etching, etch selectivity between the $p^+$-type Si layer 2 and the Si substrate 1 can be 1:100 although varying with difference in concentration of B. Although TTV of the thinned Si substrate 1 is 1 μm, approximately, TTV of the four-layered film comprising the $p^+$-type Si layer 2, Si buffer layer 3, $Si_{1-x}Ge_x$ layer 4 and Si active layer 5 becomes 50 nm or less.

Figure 12:
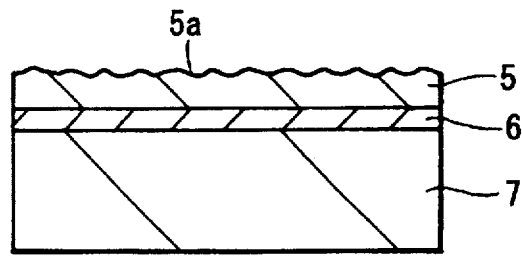
FIG. 12 is a cross-sectional view for explaining the SOI substrate: fabricating method according to the embodiment of the invention.

In the next step, the p$^+$-type Si layer 2, Si buffer layer 3 and Si$_{1-x}$Ge$_x$ layer 4 are sequentially removed to expose the surface of the Si active layer 5 as shown in FIG. 12.

For removal of the p$^+$-type Si layer 2, chemical etching using a solution containing hydrofluoric acid, nitrate and acetic acid is employed. In this etching, etch selectivity between the p$^+$-type Si layer 2 and the Si buffer layer 3 can be 1:100, approximately. Therefore, TTV of the three-layered film comprising the p$^+$-type Si layer 2, Si buffer layer 3 and Si$_{1-x}$Ge$_x$ layer 4 can be made smaller than that of the four-layered film.

For removal of the Si buffer layer 3, chemical etching using a solution containing potassium hydroxide, potassium bichromate and isopropyl alcohol (IPA) is employed. In this etching, since etch selectivity between the Si buffer layer 3 and the Si$_{1-x}$Ge$_x$ layer 4 with x=0.1 can be 1:10 or larger, TTV of the two-layered film comprising the Si buffer layer 3 and the Si$_{1-x}$Ge$_x$ layer 4 becomes very small.

Figure 13:
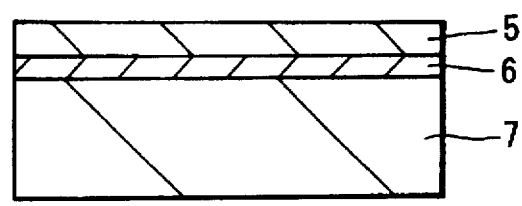
FIG. 13 is a cross-sectional view for explaining the SOI substrate fabricating method according to the embodiment of the invention.

For removal of the Si$_{1-x}$Ge$_x$ film 4, polishing or chemical etching using a solution containing hydrofluoric acid, nitrate and acetic acid is employed. If the former polishing is employed, then the surface roughness of the Si active layer 5 (FIG. 12) inheriting the surface roughness of the Si$_{1-x}$Ge$_x$ layer 4 is improved. If the latter chemical etching is employed, then the surface roughness of the Si active layer 5 inheriting the surface roughness of the Si$_{1-x}$Ge$_x$ layer 4 further increases during etching. In this case, therefore, the surface of the Si active layer 5 is polished to improve the surface roughness as shown in FIG. 13.

According to the embodiment described above, by using the B-doped p$^+$-type Si layer 2 as the first etch-stop layer and the Si$_{1-x}$Ge$_x$ layer 4 as the second etch-stop layer, TTV of the Si active layer 5 can be decreased to 5% or less of its thickness. In addition, the final surface roughness of the Si active layer 5 can be decreased to 0.2 nm or less by three steps of polishing, namely, polishing of the surface of the p$^+$-type Si layer 2 plus polishing of opposite surfaces of the Si active layer 5. As a result, SOI substrates can be fabricated, in which TTV is 10% or less of the thickness of the Si active layer 5 and the surface roughness of the Si active layer 5 is 0.3 nm or less as required when fabricating VLSI-CMOS. Accordingly, the embodiment can prevent generation of bubbles which are otherwise generated on the bonding surfaces when bonding the Si substrate 1 and another Si substrate 7, and greatly improves the reliability of devices formed on the SOI substrates by, among others, reliable fabrication of a very thin gate oxide film of a thickness of 5 nm or so on the surface of the Si active layer 5.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

As described above, the invention can successfully fabricate SOI substrates in which a silicon layer with small TTV, uniform film thickness and small surface roughness is provided on an insulating substrate.

What is claimed is:

1. A SOI substrate fabricating method comprising the steps of:

providing a silicon substrate having a surface;

making a first etch-stop layer on the surface of the silicon substrate;

polishing an exposed surface of said first etch-stop layer;

making a silicon buffer layer over the polished surface of said first etch-stop layer;

making a silicon layer over said silicon buffer layer;

making an insulating layer over said silicon layer;

bonding one surface of a support substrate onto said insulating layer; and removing said silicon substrate, said first etch-stop layer and said silicon buffer layer to provide an SOI substrate including said silicon layer on said insulating layer on said one surface of said support substrate.

2. A SOI substrate fabricating method comprising the steps of:

providing a silicon substrate having a surface;

making a first etch-stop layer on the surface of the silicon substrate;

polishing an exposed surface of said first etch-stop layer;

making a silicon buffer layer over said polished surface of said first etch-stop layer;

making a compound semiconductor layer comprising silicon and at least one of germanium and carbon over said silicon buffer layer;

making an insulating layer over said compound semiconductor layer;

bonding one surface of a support substrate onto said insulating layer; and removing said silicon substrate, said first etch-stop layer and said silicon buffer layer to provide an SOI substrate including said compound semiconductor layer on said insulating layer on said one surface of said support substrate.

3. The SOI substrate fabricating method according to claim 1, further comprising the step of making a second etch-stop layer over said silicon buffer layer after the step of making said silicon buffer layer and before the step of making said silicon layer.

4. The SOI substrate fabricating method according to claim 2, further comprising the step of making a second etch-stop layer over said silicon buffer layer after the step of making said silicon buffer layer and before the step of making said compound semiconductor layer.

5. The SOI substrate fabricating method according to claim 1, further comprising the steps of:

polishing the surface of said silicon layer after the step of making said silicon layer and before the step of making said insulating layer; and polishing an exposed surface of said silicon layer remaining after the removing step.

6. The SOI substrate fabricating method according to claim 2, further comprising the steps of:

polishing the surface of said compound semiconductor layer after the step of making said compound semiconductor layer and before the step of making said insulating layer; and polishing an exposed surface of said compound semiconductor layer remaining after the removing step.

7. The SOI substrate fabricating method according to claim 1, wherein the exposed surface of said first etch-stop layer is polished to a depth not less than 3 nm and effective to substantially remove unevenness along said exposed surface.

8. The SOI substrate fabricating method according to claim 1, wherein said first etch-stop layer is a boron-doped silicon layer.

9. The SOI substrate fabricating method according to claim 3, wherein said second etch-stop layer is a $Si_{1-x}Ge_x$ layer, wherein x is a composition ratio of Ge in said $Si_{1-x}Ge_x$ layer and is from about 0.03 to about 0.3.

10. The SOI fabricating method according to claim 8, wherein said silicon buffer layer has a thickness selected to substantially prevent diffusion of boron from said boron-doped silicon layer into said silicon layer.

11. The SOI substrate fabricating method according to claim 9, wherein said second etch-stop layer comprising said $Si_{1-x}Ge_x$ layer is also removed in said removing step.

12. The SOI substrate fabricating method according to claim 2, wherein the exposed surface of said first etch-stop layer is polished to a depth not less than 3 nm and effective to substantially remove unevenness along said exposed surface.

13. The SOI substrate fabricating method according to claim 2, wherein said first etch-stop layer is a boron-doped silicon layer.

14. The SOI substrate fabricating method according to claim 4, wherein said second etch-stop layer is a $Si_{1-x}Ge_x$ layer, wherein x is a composition ratio of Ge in said $Si_{1-x}Ge_x$ layer and is from about 0.03 to about 0.3.

15. The SOI substrate fabricating method according to claim 13, wherein said silicon buffer layer has a thickness selected to substantially prevent diffusion of boron from said boron-doped silicon layer into said silicon layer.

16. The SOI substrate fabricating method according to claim 14, wherein said second etch-stop layer comprising said $Si_{1-x}Ge_x$ layer is also removed in said removing step.

17. The SOI substrate fabricating method according to claim 8, wherein said silicon buffer layer has a thickness of from about 10 nm to about 1 μm.

18. The SOI substrate fabricating method according to claim 13, wherein said silicon buffer layer has a thickness of from about 10 nm to about 1 μm.

19. The SOI substrate fabricating method according to claim 1, wherein said first etch-stop layer is a boron-doped silicon layer having a boron-doping concentration of greater than or equal to $5 \times 10^{19} cm^{-3}$.

20. The SOI substrate fabricating method according to claim 2, wherein said first etch-stop layer is a boron-doped silicon layer having a boron-doping concentration of greater than or equal to $5 \times 10^{19} cm^{-3}$.

* * * * *